United States Patent
Nambu et al.

(10) Patent No.: US 11,536,791 B1
(45) Date of Patent: Dec. 27, 2022

(54) MAGNETIC RESONANCE IMAGING APPARATUS, METHOD FOR IDENTIFYING BODY MOTION-RELATED SHOT, AND COMPUTER-READABLE NON-VOLATILE STORAGE MEDIUM STORING THEREIN BODY MOTION-RELATED SHOT IDENTIFICATION PROGRAM

(71) Applicant: CANON MEDICAL SYSTEMS CORPORATION, Otawara (JP)

(72) Inventors: Masahito Nambu, Utsunomiya (JP); Samir Dev Sharma, Vernon Hills, IL (US); Anuj Sharma, Vernon Hills, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/455,255

(22) Filed: Nov. 17, 2021

(51) Int. Cl.
*G01R 33/565* (2006.01)
*G01R 33/56* (2006.01)

(52) U.S. Cl.
CPC ... *G01R 33/56509* (2013.01); *G01R 33/5608* (2013.01)

(58) Field of Classification Search
CPC .............. G01R 33/56509; G01R 33/5608
See application file for complete search history.

(56) References Cited

U.S. PATENT DOCUMENTS

| | | | |
|---|---|---|---|
| 2004/0133096 A1* | 7/2004 | Taniguchi | G01R 33/5676 600/410 |
| 2017/0219672 A1* | 8/2017 | Miyazaki | G01R 33/5635 |
| 2019/0250224 A1* | 8/2019 | Zeller | G01R 33/5602 |

FOREIGN PATENT DOCUMENTS

JP      2021-29777 A     3/2021

* cited by examiner

*Primary Examiner* — Gregory H Curran
(74) *Attorney, Agent, or Firm* — Oblon, McClelland, Maier & Neustadt, L.L.P.

(57) ABSTRACT

A magnetic resonance imaging apparatus according to an embodiment includes a processing circuit. The processing circuit acquires a plurality of echo signals not to be encoded corresponding to a plurality of respective shots about acquisition of a plurality of echo signals having been encoded by magnetic resonance imaging for a subject, compares the echo signals not to be encoded with each other about the shots, and identifies a shot to be removed about generation of a magnetic resonance image about the subject out of the shots based on a comparison result of the echo signals not to be encoded.

13 Claims, 6 Drawing Sheets

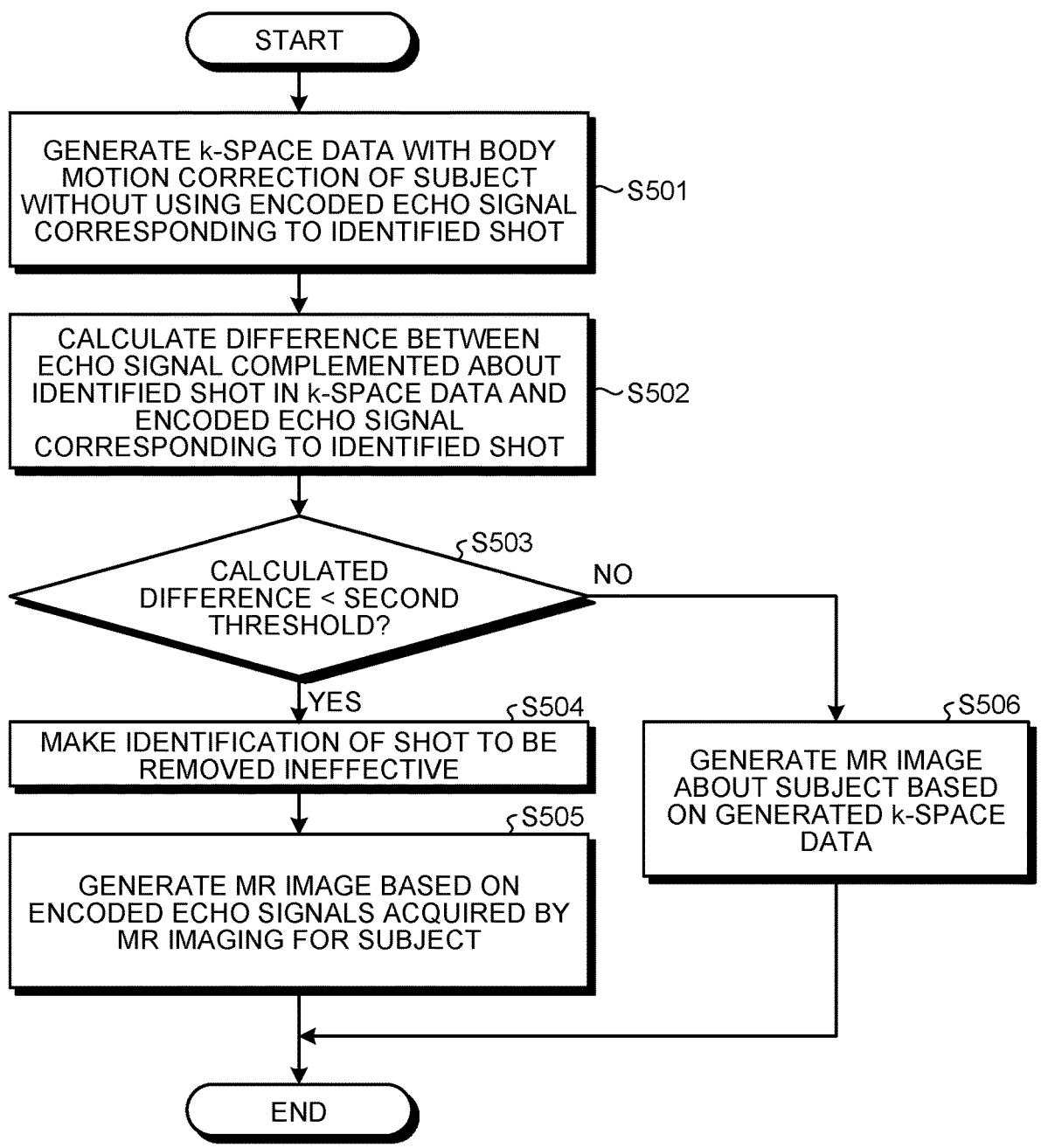

FIG.6

| D1 / D2 | D1 ≤ FIRST THRESHOLD | FIRST UPPER LIMIT VALUE ≥ D1 > FIRST THRESHOLD | D1 > FIRST UPPER LIMIT VALUE |
|---|---|---|---|
| D2 ≤ SECOND THRESHOLD | MAKE IDENTIFICATION OF SHOT INEFFECTIVE | MAKE IDENTIFICATION OF SHOT INEFFECTIVE | MAKE IDENTIFICATION OF SHOT EFFECTIVE |
| SECOND UPPER LIMIT VALUE ≥ D2 > SECOND THRESHOLD | MAKE IDENTIFICATION OF SHOT INEFFECTIVE | MAKE IDENTIFICATION OF SHOT INEFFECTIVE | MAKE IDENTIFICATION OF SHOT EFFECTIVE |
| D2 > SECOND UPPER LIMIT VALUE | MAKE IDENTIFICATION OF SHOT EFFECTIVE | MAKE IDENTIFICATION OF SHOT EFFECTIVE | MAKE IDENTIFICATION OF SHOT EFFECTIVE |

MAGNETIC RESONANCE IMAGING APPARATUS, METHOD FOR IDENTIFYING BODY MOTION-RELATED SHOT, AND COMPUTER-READABLE NON-VOLATILE STORAGE MEDIUM STORING THEREIN BODY MOTION-RELATED SHOT IDENTIFICATION PROGRAM

FIELD

Embodiments described herein relate generally to a magnetic resonance imaging apparatus, a method for identifying a body motion-related shot, and a computer-readable non-volatile storage medium storing therein a body motion-related shot identification program.

BACKGROUND

Generation of magnetic resonance images has conventionally been vulnerable to the motion of a subject to be imaged. Thus, even when the subject being imaged just moves a little, an artifact occurs in a generated magnetic resonance image. Given these circumstances, to reduce artifacts by the motion of the subject in magnetic resonance images, methods identifying data in motion (hereinafter, called motion data) in data of k-space about generation of magnetic resonance images are developed. Examples of the methods include a method identifying the motion data in k-space by tracking the motion of the subject using a navigator, a method calculating the motion amount of all data in k-space from a physical model, and a method performing motion correction on all data of k-space without identifying the motion data.

However, when the navigator is used, an additional sequence is required, which may prolong an imaging time. Calculating the motion amount from the physical model or executing the motion correction on all the data may involve high calculation costs and take much time.

BRIEF DESCRIPTION OF THE DRAWINGS

FIG. 5 is a flowchart of an example of a procedure of the removal determination processing according to a second application example of the embodiment; and FIG. 6 is a diagram of an example about making identification of a shot to be removed effective or ineffective by a first threshold and a second threshold in a first difference and a second difference according to a third application example of the embodiment.

DETAILED DESCRIPTION

The following describes a magnetic resonance imaging (hereinafter, called MRI) apparatus, a method for identifying a body motion-related shot, and a computer-readable non-volatile storage medium storing therein a body motion-related shot identification program with reference to the accompanying drawings. In the following embodiment, parts denoted by the same reference symbol are assumed to operate in a similar manner, and a duplicated description is omitted as appropriate. To make the description specific, the method for identifying a body motion-related shot and the body motion-related shot identification program are described as being implemented by the MRI apparatus.

The technical features about the method for identifying a body motion-related shot and/or the body motion-related shot identification program may be implemented by a server apparatus (a medical information processing apparatus, a medical image processing apparatus, or the like) that can implement the method for identifying a body motion-related shot and/or the body motion-related shot identification program. In this case, the server apparatus is assumed to be included in the MRI apparatus.

The technical thought of the present embodiment may be applied to various kinds of modalities combined with the MRI apparatus such as a positron emission tomography (PET)-MRI apparatus and a single photon emission computed tomography (SPECT)-MRI apparatus.

An object of the present embodiment is to detect the body motion of a subject about body motion correction without performing any complicated calculations. One of the problems to be solved by the embodiment disclosed in the present specification and drawings is to detect the body motion of the subject about body motion correction without performing any complicated calculations, for example. However, the problem to be solved by the embodiment disclosed in the present specification and drawings is not limited to the above problem. Problems corresponding to respective effects by respective configurations shown in the embodiment described below can also be regarded as other problems. The MRI apparatus described in the following embodiment includes a processing circuit acquiring a plurality of echo signals not to be encoded corresponding to a plurality of respective shots about acquisition of a plurality of echo signals having been encoded by magnetic resonance imaging for a subject, comparing the echo signals not to be encoded with each other about the shots, and identifying a shot to be removed about generation of a magnetic resonance image about the subject out of the shots based on a comparison result of the echo signals not to be encoded.

Embodiment

Figure 1:
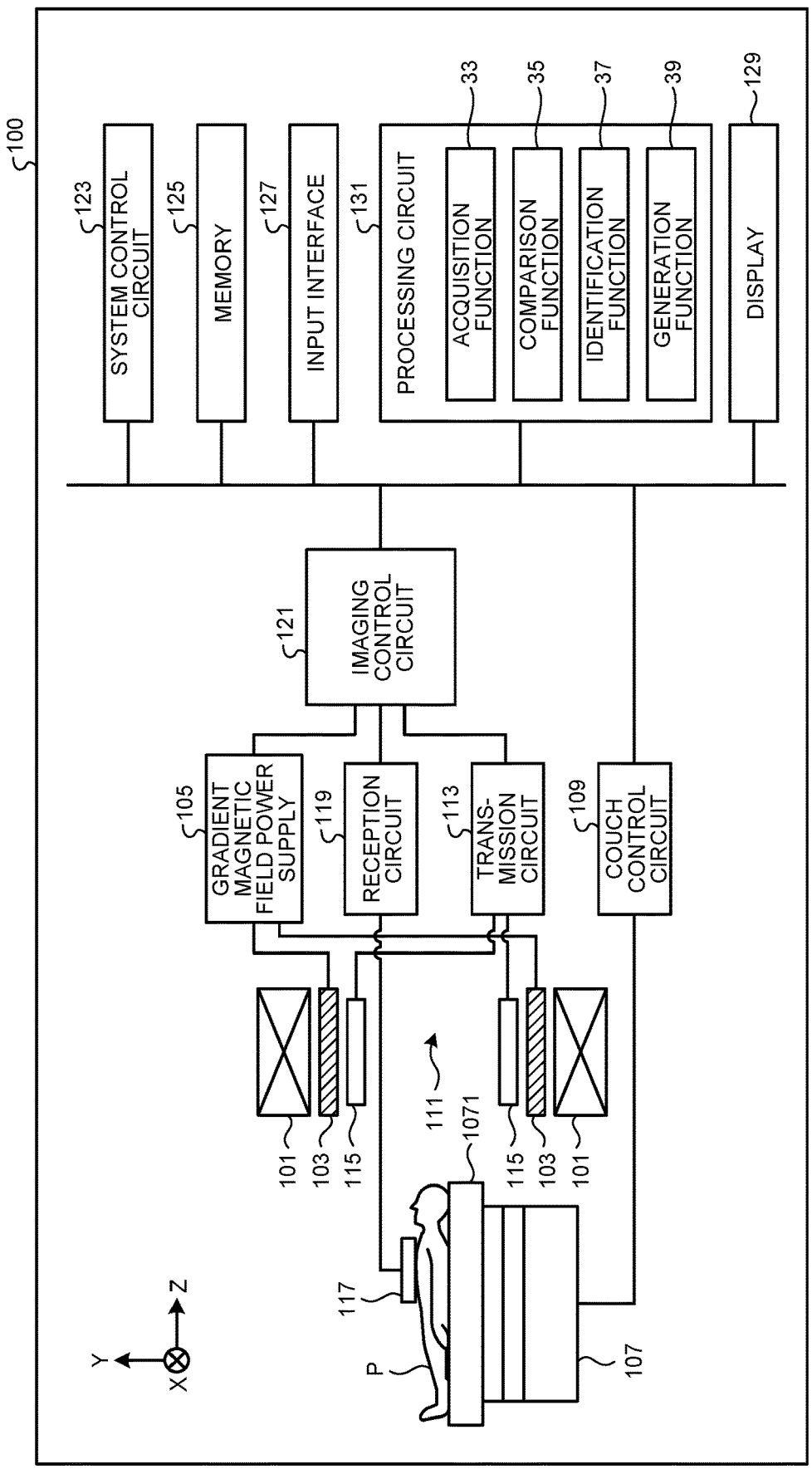
FIG. 1 is a diagram of an example of a magnetic resonance imaging (MRI) apparatus according to an embodiment.

FIG. 1 is a diagram of an example of an MRI apparatus 100 according to the present embodiment. As illustrated in FIG. 1, the MRI apparatus 100 includes a static magnetic field magnet 101, a gradient coil 103, a gradient magnetic field power supply 105, a couch 107, a couch control circuit 109, a transmission circuit 113, a transmission coil 115, a reception coil 117, a reception circuit 119, an imaging control circuit (an imaging controller) 121, a system control circuit (a system controller) 123, a memory 125, an input interface 127, a display 129, and a processing circuit 131.

The static magnetic field magnet 101 is a magnet formed in a hollow substantially cylindrical shape. The static magnetic field magnet 101 generates a substantially uniform static magnetic field in the inside space. As the static magnetic field magnet 101, a superconducting magnet is used, for example.

The gradient coil 103 is a coil formed in a hollow substantially cylindrical shape and is placed on an inner face side of a cylindrical cooling vessel. The gradient coil 103 individually receives current supply from the gradient magnetic field power supply 105 to generate a gradient magnetic field, in which magnetic field intensity changes along each of X, Y, and Z axes orthogonal to each other. The gradient magnetic field of each of the X, Y, and Z axes generated by the gradient coil 103 forms a gradient magnetic field for slice selection, a gradient magnetic field for phase encoding, and a gradient magnetic field for frequency encoding, for example. The gradient magnetic field for slice selection is used in order to determine any imaging section. The gradient magnetic field for phase encoding is used in order to change the phase of a magnetic resonance signal (hereinafter, called an MR signal) in accordance with a spatial position. The gradient magnetic field for frequency encoding is used in order to change the frequency of the MR signal in accordance with a spatial position.

The gradient magnetic field power supply 105 is a power supply apparatus supplying a current to the gradient coil 103 by the control of the imaging control circuit 121.

The couch 107 is an apparatus including a couchtop 1071 on which a subject P is placed. The couch 107 inserts the couchtop 1071 on which the subject P is placed into a bore 111 under control by the couch control circuit 109.

The couch control circuit 109 is a circuit controlling the couch 107. The couch control circuit 109 drives the couch 107 through an instruction by an operator via the input/output interface 127 to move the couchtop 1071 in a longitudinal direction and an up-and-down direction or, under some circumstances, a right-and-left direction.

The transmission circuit 113 supplies a high-frequency pulse modulated with a Larmor frequency to the transmission coil 115 by the control of the imaging control circuit 121. The transmission circuit 113 has an oscillator, a phase selection unit, a frequency conversion unit, an amplitude modulator, and a radio frequency (RF) amplifier, for example. The oscillator generates an RF pulse with a resonance frequency unique to a target nucleus in the static magnetic field. The phase selection unit selects a phase of the RF pulse generated by the oscillator. The frequency conversion unit converts a frequency of the RF pulse output from the phase selection unit. The amplitude modulator modulates an amplitude of the RF pulse output from the frequency conversion unit in accordance with a sinc function, for example. The RF amplifier amplifies the RF pulse output from the amplitude modulator to supply the RF pulse to the transmission coil 115.

The transmission circuit 113 supplies a high-frequency pulse (hereinafter, called a dummy high-frequency pulse) for acquiring an echo signal not to be encoded (hereinafter, called a dummy echo signal) to the transmission coil 115 by the control of the imaging control circuit 121. The dummy high-frequency pulse is used in order to improve the stability of collection of a plurality of echo signals having been encoded, for example. The transmission circuit 113 supplies the dummy high-frequency pulse constantly at the same intensity to the transmission coil 115. The dummy high-frequency pulse is not limited to being generated by the transmission circuit and may be supplied from the gradient magnetic field power supply 105 to the gradient coil 103 by the control of the imaging control circuit 121 for the gradient magnetic field power supply 105, for example.

The transmission coil 115 is an RF coil placed inside the gradient coil 103. The transmission coil 115 generates an RF pulse corresponding to a high-frequency magnetic field in accordance with output from the transmission circuit 113. The RF pulse is generated in acquisition of an echo signal having been encoded, for example. In the following, the RF pulse about the acquisition of the echo signal having been encoded (hereinafter, called an encoded echo signal) is called a shot. In other words, a plurality of shots correspond to a plurality of RF pulses about acquisition of a plurality of encoded echo signals. The encoded echo signal for one shot is charged in accordance with the gradient magnetic field for frequency encoding along a line (hereinafter, called a phase encoding line) corresponding to one phase encoding value (a ky value) in accordance with the magnitude of the gradient magnetic field for phase encoding, for example. The encoded echo signal for one shot is not limited to charging to one phase encoding line and may be charged in accordance with the gradient magnetic field for frequency encoding along a plurality of phase encoding lines in the case of a high-speed spin echo method, for example. In the following, to make the description specific, it is assumed that there are a plurality of shots in MR imaging for the subject P.

The transmission coil 115 generates a high-frequency magnetic field corresponding to the dummy high-frequency pulse as a dummy pulse in accordance with output from the transmission circuit 113. When the dummy high-frequency pulse is implemented by the gradient magnetic field power supply 105, the dummy pulse is generated by the gradient coil 103 in accordance with the dummy high-frequency pulse supplied from the gradient magnetic field power supply 105 to the gradient coil 103. The generation of the dummy pulse is performed at a certain time before and after application of the RF pulse to the subject P.

The reception coil 117 is an RF coil placed inside the gradient coil 103. The reception coil 117 receives the MR signal radiated from the subject P through the high-frequency magnetic field. The reception coil 117 outputs the received MR signal to the reception circuit 119. The reception coil 117 is a coil array having one or more or typically a plurality of coil elements (hereinafter, called coils), for example. In the following, to make the description specific, the reception coil 117 is described as a coil array having three coils as the coils.

The reception coil 117 receives a dummy echo radiated from the subject P through the dummy pulse. The reception coil 117 outputs the received dummy echo to the reception circuit 119. When the subject P does not move during execution of the MR imaging for the subject P, a signal value of the dummy echo signal is substantially constant in accordance with the coils.

Although in FIG. 1 the transmission coil 115 and the reception coil 117 are illustrated as separate RF coils, the transmission coil 115 and the reception coil 117 may be implemented as an integrated transmission-and-reception coil. The transmission-and-reception coil corresponds to a site to be imaged of the subject P and is a local transmission-and-reception RF coil such as a head coil, for example.

The reception circuit 119 generates a digital encoded echo signal based on the MR signal output from the reception coil 117 by the control of the imaging control circuit 121. The digital encoded echo signal is also referred to as MR data. Specifically, the reception circuit 119 performs signal processing such as detection and filtering on the MR signal output from the reception coil 117 and then performs analog to digital (A/D) conversion (hereinafter, called A/D conversion) on the data subjected to the signal processing to generate the encoded echo signal. The reception circuit 119 outputs the generated encoded echo signal to the imaging control circuit 121. The encoded echo signal is generated in each of the coils and is output to the imaging control circuit 121 together with a tag identifying each of the coils, for example.

The reception circuit 119 generates a digital dummy echo (hereinafter, called a dummy echo signal) based on the dummy echo output from the reception coil 117 by the control of the imaging control circuit 121. Specifically, the reception circuit 119 performs signal processing such as detection and filtering on the dummy echo output from the reception coil 117 and then performs analog to digital (A/D) conversion (hereinafter, called A/D conversion) on the data subjected to the signal processing to generate the dummy echo signal. The reception circuit 119 outputs the generated dummy echo signal to the imaging control circuit 121. The dummy echo signal is generated in each of the coils and is output to the imaging control circuit 121 together with a tag identifying each of the coils, for example.

The imaging control circuit 121 controls the gradient magnetic field power supply 105, the transmission circuit 113, the reception circuit 119, and the like in accordance with an imaging protocol output from a processing circuit 15 to perform imaging for the subject P. The imaging protocol has a pulse sequence corresponding to the type of inspection. The imaging protocol defines the magnitude of the current supplied to the gradient coil 103 by the gradient magnetic field power supply 105, the time at which the current is supplied to the gradient coil 103 by the gradient magnetic field power supply 105, the magnitude and the duration of the high-frequency pulse supplied to the transmission coil 115 by the transmission circuit 113, the time at which the high-frequency pulse is supplied to the transmission coil 115 by the transmission circuit 113, the time at which the MR signal is received by the reception coil 117, and the like. In addition, the imaging protocol defines the magnitude and the duration of the dummy high-frequency pulse supplied to the transmission coil 115 by the transmission circuit 113, the time at which the dummy high-frequency pulse is supplied to the transmission coil 115 by the transmission circuit 113, the time at which the dummy echo is received by the reception coil 117, and the like. The imaging control circuit 121 supplies the dummy high-frequency pulse to the transmission circuit 113 and acquires the dummy echo signal from the reception circuit 119 in each of the shots.

The imaging control circuit 121 drives the gradient magnetic field power supply 105, the transmission circuit 113, the reception circuit 119, and the like to image the subject P and, upon reception of the encoded echo signal from the reception circuit 119, transfers the received encoded echo signal to the processing circuit 131. Upon reception of the dummy echo signal from the reception circuit 119 during the execution of the MR imaging for the subject P, the imaging control circuit 121 transfers the received dummy echo signal to the processing circuit 131.

The imaging control circuit 121 is implemented by a processor, for example. The term "processor" means circuits such as a central processing unit (CPU), a graphics processing unit (GPU), an application specific integrated circuit (ASIC), and programmable logic devices (a simple programmable logic device (SPLD), a complex programmable logic device (CPLD), and a field programmable gate array (FPGA), for example), for example.

The system control circuit 123 has a processor and memories such as a read-only memory (ROM) and a random access memory (RAM), which are not illustrated, as hardware resources and controls the MRI apparatus 100 by a system control function. Specifically, the system control circuit 123 reads a system control program stored in a memory, develops it onto a memory, and controls the circuits of the MRI apparatus 100 in accordance with the developed system control program.

The system control circuit 123 reads the imaging protocol from the memory 125 based on an imaging condition input from an operator via the input interface 127, for example. The system control circuit 123 transmits the imaging protocol to the imaging control circuit 121 to control imaging for the subject P. The system control circuit 123 is implemented by a processor, for example. The system control circuit 123 may be incorporated into the processing circuit 15. In this case, the system control function is executed by the processing circuit 15, and the processing circuit 15 functions as an alternative to the system control circuit 123. The processor implementing the system control circuit 123 has details similar to the above, and a description thereof is omitted.

The memory 125 stores therein various kinds of computer programs about the system control function executed by the system control circuit 123, various kinds of imaging protocols, imaging conditions including a plurality of imaging parameters prescribing the imaging protocols, and the like. The memory 125 stores therein an acquisition function 33, a comparison function 35, an identification function 37, and a generation function 39 implemented by the processing circuit 15 in computer-executable program form.

The memory 125 stores therein the dummy echo signal acquired by the acquisition function 33, various kinds of data for use in processing performed by the identification function 37 and the generation function 39, a magnetic resonance (MR) image generated by the generation function 39, various kinds of data generated in a generation process of the MR image, and the like. The various kinds of data stored in the memory 125 will be described later. The memory 125 stores therein the encoded echo signal acquired by scanning for the subject P and an algorithm reconstructing the MR image based on the encoded echo signal.

The memory 125 is implemented by a semiconductor memory element such as a ROM, a RAM, or a flash memory, a hard disk drive (HDD), a solid state drive (SSD), or an optical disc, for example. The memory 125 may be implemented by a compact disc (CD)-ROM drive, a digital versatile disc (DVD) drive, or a drive reading and writing various information from and into a portable storage medium such as a flash memory.

The input interface 127 receives various kinds of instructions (a power-on instruction, for example) and information input from the operator. The input interface 127 is implemented by a trackball, a switch button, a mouse, a keyboard, a touch pad performing an input operation through touching an operating face, a touch screen with a display screen and a touch pad integrated, a noncontact input circuit including an optical sensor, or a voice input circuit, for example. The input interface 127, which is connected to the processing circuit 131, converts an input operation received from the operator into an electric signal, and outputs the converted electric signal to the processing circuit 131. In the present specification, the input interface 127 is not limited to one including a physical operating part such as a mouse or a keyboard. Examples of the input interface 127 include an electric signal processing circuit receiving an electric signal corresponding to an input operation from an external input device provided separately from the MRI apparatus 100 and outputting this electric circuit to a control circuit.

The display 129 displays the MR image generated by various kinds of graphical user interfaces (GUIs) or the generation function 39 of the processing circuit 131 and the like under control by the processing circuit 131 or the system control circuit 123. The display 129 displays imaging parameter about scan, various kinds of information about image processing, and the like. The display 129 is implemented by a cathode ray tube (CRT) display, a liquid crystal display, an organic electroluminescence (EL) display, a light-emitting diode (LED) display, a plasma display, or a display device such as any other displays and monitors known in the technical field concerned, for example.

The processing circuit 131 is implemented by the processor described above, for example. The processing circuit 131 includes the acquisition function 33, the comparison function 35, the identification function 37, and the generation function 39. The processing circuit 131 implementing the acquisition function 33, the comparison function 35, the identification function 37, and the generation function 39 corresponds to an acquisition unit, a comparison unit, an identification unit, and a generation unit, respectively. Each function such as the acquisition function 33, the comparison function 35, the identification function 37, or the generation function 39 is stored in computer-executable program form in the memory 125. The processing circuit 131 reads the computer program from the memory 125 and executes it to implement a function corresponding to each computer program, for example. In other words, the processing circuit 131 having read each computer program has each function such as the acquisition function 33, the comparison function 35, the identification function 37, or the generation function 39.

Although the above description describes an example in which the "processor" reads the computer program corresponding to each function from the memory 125 and executes it, the embodiment is not limited to this example. When the processor is a CPU, for example, the processor reads the computer program stored in the memory 125 and executes it to implement the function. On the other hand, when the processor is an ASIC, in place of storing the computer program in the memory 125, the function is directly incorporated as a logic circuit into the circuit of the processor. Each processor of the present embodiment is not limited to the case in which each processor is configured as a single circuit, and a plurality of independent circuits may be combined to be configured as one processor and to implement the function. Although a single storage circuit storing therein the computer program corresponding to each processing function has been described, a plurality of storage circuits may be placed in a distributed manner, and the processing circuit 131 may read a corresponding computer program from an individual storage circuit.

The processing circuit 131 acquires a plurality of echo signals not to be encoded corresponding to the respective shots about the acquisition of the echo signals having been encoded by the MR imaging for the subject P by the acquisition function 33. That is to say, the acquisition function 33 acquires the dummy echo signal in each of the shots. The acquisition function 33 causes the memory 125 to store therein the acquired dummy echo signal. When the processing circuit 131 is installed in the server such as the medical information processing apparatus or the medical image processing apparatus, the acquisition function 33 acquires the dummy echo signal from a normal MRI apparatus.

The processing circuit 131 compares the echo signals not to be encoded with each other about the shots by the comparison function 35. That is to say, the comparison function 35 compares a plurality of dummy echo signals corresponding to the respective shots with each other. Specifically, the comparison function 35, with an echo signal not to be encoded about a shot as a reference (hereinafter, called a reference shot) among the shots in the echo signals not to be encoded as a reference echo signal, compares the reference echo signal and the echo signals not to be encoded with each other. The reference shot is a shot executed first (hereinafter, called a first shot) among the shots, for example. In the following, the dummy echo signal about the reference shot is called the reference echo signal.

More specifically, the comparison function 35 calculates a correlation value of the dummy echo signal between the first shot and the other shots for each of the coils in each of the shots. The comparison function 35 may calculate a differential value in place of the correlation value. When the number of the shots is four, for example, the comparison function 35 calculates a correlation value between the reference echo signal and the dummy echo signal in a second shot, a correlation value between the reference signal and the dummy echo signal in a third shot, and a correlation value between the reference signal and the dummy echo signal in a fourth shot for each of the coils. That is to say, when the total number of the shots is N (N is a natural number of 2 or more), and when the total number of the coils is M (M is a natural number of 1 or more), the comparison function 35 calculates (N−1)×M correlation values as a comparison result.

The processing circuit 131 identifies a shot to be removed about generation of the MR image about the subject P out of the shots based on the comparison result of the echo signals not to be encoded by the identification function 37. The identification function 37 identifies a shot about an echo signal not to be encoded having the smallest correlation with the reference echo signal out of the echo signals not to be encoded as the shot to be removed, for example. The identification function 37, when the correlations values are comparable to each other about the shots, identifies the shot as a reference as the shot to be removed.

Specifically, the identification function 37 identifies a shot to which the dummy echo signal about the smallest correlation value belongs among the correlation values calculated by the comparison function 35 in the shots. The identification function 37, when the correlation values are substantially comparable to each other, that is, the correlation values are included in a preset range, identifies the first shot as the shot to be removed. The certain range is a range of 0.9999 to 0.9995, for example, which is set in advance and is stored in the memory 125.

The processing circuit 131 generates the MR image about the subject P without using the echo signal having been encoded corresponding to the shot having been identified (hereinafter, called an identified shot) by the generation function 39. Specifically, the generation function 39 generates the MR image with body motion correction of the subject P without using the encoded echo signal corresponding to the identified shot. The generation function 39, without using the encoded echo signal about the identified shot, that is, places the encoded echo signals about the other shots except the identified shot in k-space based on the gradient magnetic field for frequency encoding and the gradient magnetic field for phase encoding, for example. The generation function 39 generates the MR image by reconstruction processing with body motion correction on the encoded echo signals placed in k-space. For the body motion correction, a known technique can be used as appropriate, and thus a description thereof is omitted.

Figure 2:
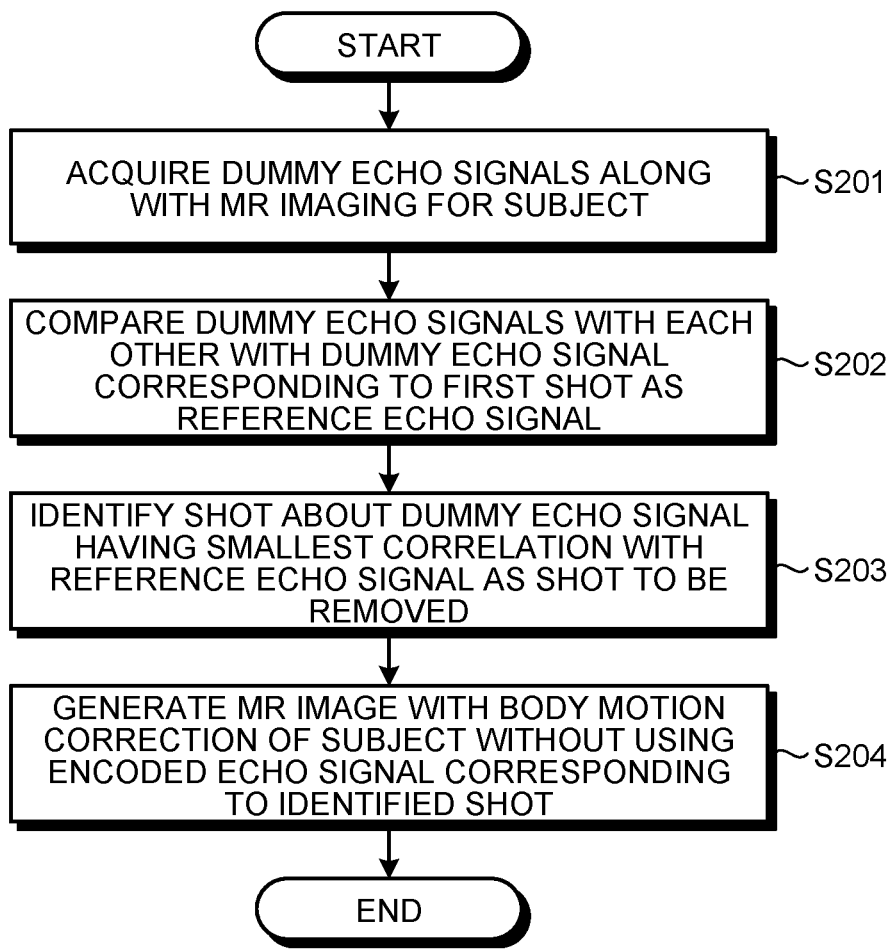
FIG. 2 is a flowchart of an example of a procedure of body motion correction processing according to the embodiment.
Figure 3:
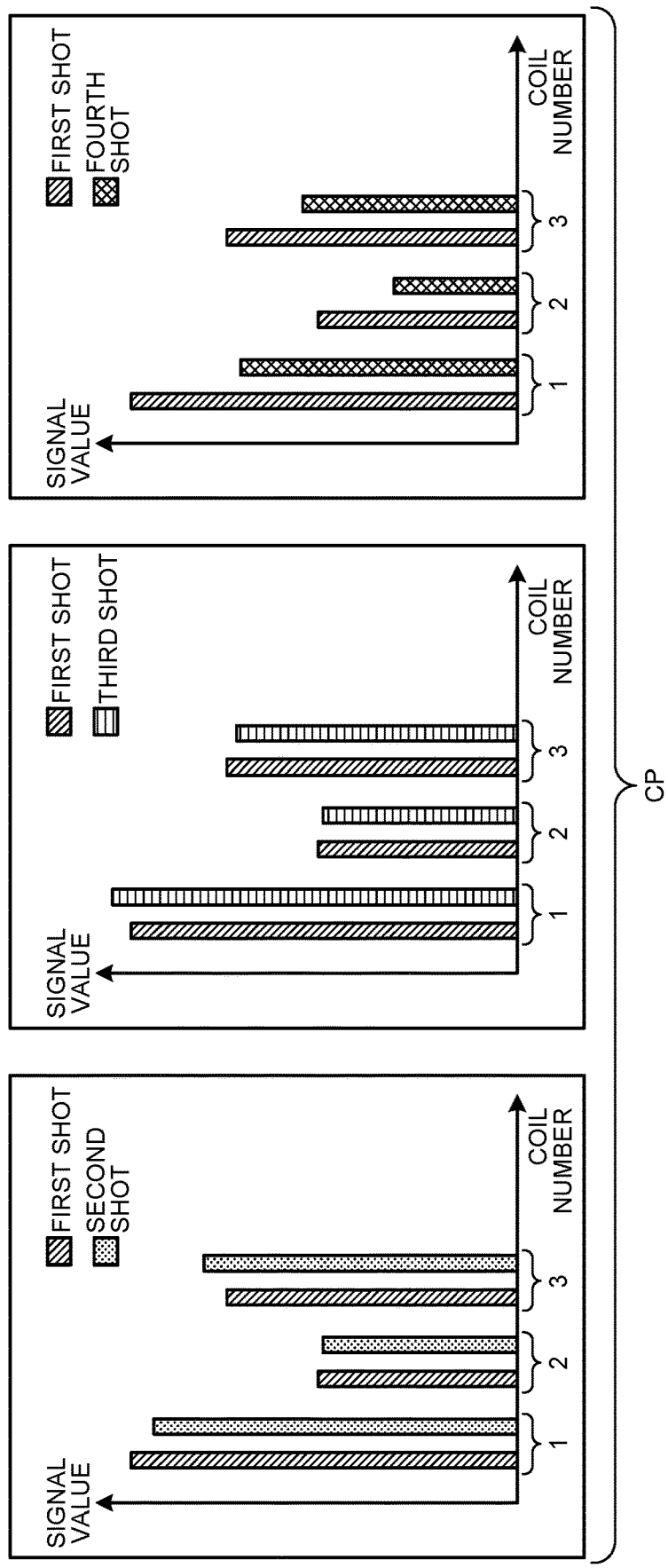
FIG. 3 is a diagram of an example of a comparison CP with a plurality of dummy echo signals, with a dummy echo signal about a first shot as a reference echo signal, in other shots (second to fourth shots) according to the embodiment.

The following describes body motion correction processing executed by the MRI apparatus 100 of the present embodiment configured as in the foregoing with reference to FIG. 2 and FIG. 3. The body motion correction processing is processing identifying a shot about the body motion of the subject based on the dummy echo signal and generating the MR image without using the encoded echo signal about the shot having been identified. In the following, to make the description specific, it is assumed that the number of the coils of the reception coil 117 is three, whereas the number of the shots is four.

FIG. 2 is a flowchart of an example of a procedure of the body motion correction processing. FIG. 3 is a diagram of an example of the reference echo signal as a comparison reference and the dummy echo signal for each shot and each coil in the body motion correction processing.

Body Motion Correction Processing

Step S201

The imaging control circuit 121 executes the dummy pulse for each shot and executes the MR imaging for the subject P. The processing circuit 131 acquires the dummy echo signal for each shot by the acquisition function 33. The acquisition function 33 stores the acquired dummy echo signals in the memory 125. When the body motion correction processing is implemented by the server apparatus such as the medical information processing apparatus or the medical image processing apparatus, the acquisition function 33 acquires the dummy echo signals from the normal MRI apparatus.

Step S202

The processing circuit 131 compares the dummy echo signals with each other for each of the coils with the dummy echo signal corresponding to the first shot as the reference echo signal by the comparison function 35. The comparison function 35 calculates a correlation value of the dummy echo signal with respect to the reference echo signal for each shot and each coil, for example. The comparison function 35 stores the calculated correlation values as the comparison result in the memory 125.

FIG. 3 is a diagram of an example of a comparison CP with the dummy echo signals in the other shots (the second to fourth shots) with the dummy echo signal about the first shot as the reference signal. As illustrated in FIG. 3, in the first shot and the second shot and in the first shot and the third shot, the dummy echo signal acquired from each of the first to third coils and the reference echo signal have comparable signal values. Thus, both the correlation value about the first shot and the second shot and the correlation value about the first shot and the third shot are values close to 1.

On the other hand, as illustrated in FIG. 3, in the first shot and the fourth shot, the signal value of the dummy echo signal acquired from each of the first to third coils is lower than the signal value of the reference echo signal. Thus, the correlation value about the first shot and the fourth shot is a value lower than 1.

Step S203

The processing circuit 131 identifies a shot about the dummy echo signal having the smallest correlation with the reference echo signal as a shot to be removed about MR image generation by the identification function 37. In FIG. 3, the fourth shot is identified as the shot to be removed. In FIG. 3, when the correlation values about the other shots with respect to the first shot are all comparable to each other, the identification function 37 identifies the first shot as the shot to be removed. The identification function 37 stores the shot having been identified (the identified shot) in the memory 125. The difference of the dummy echo signal with respect to the reference echo signal corresponds to the magnitude of the body motion of the subject P, and thus the identified shot corresponds to a shot at a point in time when the body motion of the subject P is the largest.

Step S204

The processing circuit 131 generates the MR image with the body motion correction of the subject P without using the encoded echo signal corresponding to the identified shot by the generation function 39. That is to say, the generation function 39 executes body motion correction for the encoded echo signals corresponding to the other shots except the identified shot to generate the MR image. The generation function 39 stores the generated MR image in the memory 125. The generation function 39 may display the generated MR image on the display 129.

The MRI apparatus 100 according to the embodiment described in the foregoing acquires the dummy echo signals corresponding to the respective shots about the acquisition of the encoded echo signals by the MR imaging for the subject P, compares the dummy echo signals with each other about the shots, and identifies the shot to be removed about the generation of the MR image about the subject P out of the shots based on the comparison result of the dummy echo signals. The MRI apparatus 100 according to the embodiment, with the dummy echo signal about the reference shot in the dummy echo signals as the reference echo signal, calculates the correlation values between the reference echo signal and the dummy echo signals as the comparison result, for example. In the MRI apparatus 100 according to the embodiment, the reference shot is a shot executed first among the shots. The MRI apparatus 100 according to the embodiment generates the MR image with the body motion correction of the subject P without using the encoded echo signal corresponding to the identified shot, for example.

The MRI apparatus 100 according to the embodiment identifies the shot about the dummy echo signal having the smallest correlation with the reference echo signal out of the dummy echo signals as the shot to be removed. On the other hand, the MRI apparatus 100 according to the embodiment, when the correlation values are comparable to each other about the shots, identifies the reference shot as the shot to be removed.

From these, the MRI apparatus 100 according to the embodiment can detect the motion (body motion) of the subject P by utilizing that the dummy echo signals, for which encoding is not performed, can be collected with theoretically constantly the same intensity signal value and that the signal value of the dummy echo signals changes along with a change in the relative positional relation between the MRI apparatus 100 and/or each of the coils and the subject P along with the motion of the subject P. That is to say, the MRI apparatus 100 according to the embodiment can monitor the motion of the subject P for each shot using the dummy echo signals used in order to improve the stability of the collection of the encoded echo signals, for example.

Thus, the MRI apparatus 100 according to the embodiment can detect the body motion of the subject about body motion correction by calculation of the correlation values, which involve low calculation costs, without performing any high-cost, complicated calculations, and without prolonging an imaging time. Thus, the MRI apparatus 100 according to the present embodiment removes the MR data about the shot corresponding to the detected body motion, that is, data in motion from reconstruction and can thereby effectively reduce an influence about the body motion of the subject P, or a motion artifact, and generate the MR image with improved image quality. From the foregoing, the MRI apparatus 100 according to the present embodiment does not reduce the throughput of the MR imaging for the subject P and can at the same time improve the throughput of image diagnosis about the subject P.

First Application Example

In the embodiment, even when there is no body motion in the subject P, the encoded echo signal for use in the generation of the MR image is removed by the influence of noise or the like. Given these circumstances, when there is no body motion in the subject P, a signal-to-noise ratio (hereinafter, called an SNR) in the MR image generated in the embodiment reduces, and the influence of noise may appear in the MR image, or that is to say, a noisy MR image may be given. From these, the present application example executes determination of effectiveness or ineffectiveness (hereinafter, called removal determination) about the identification of the shot to be removed.

Figure 4:
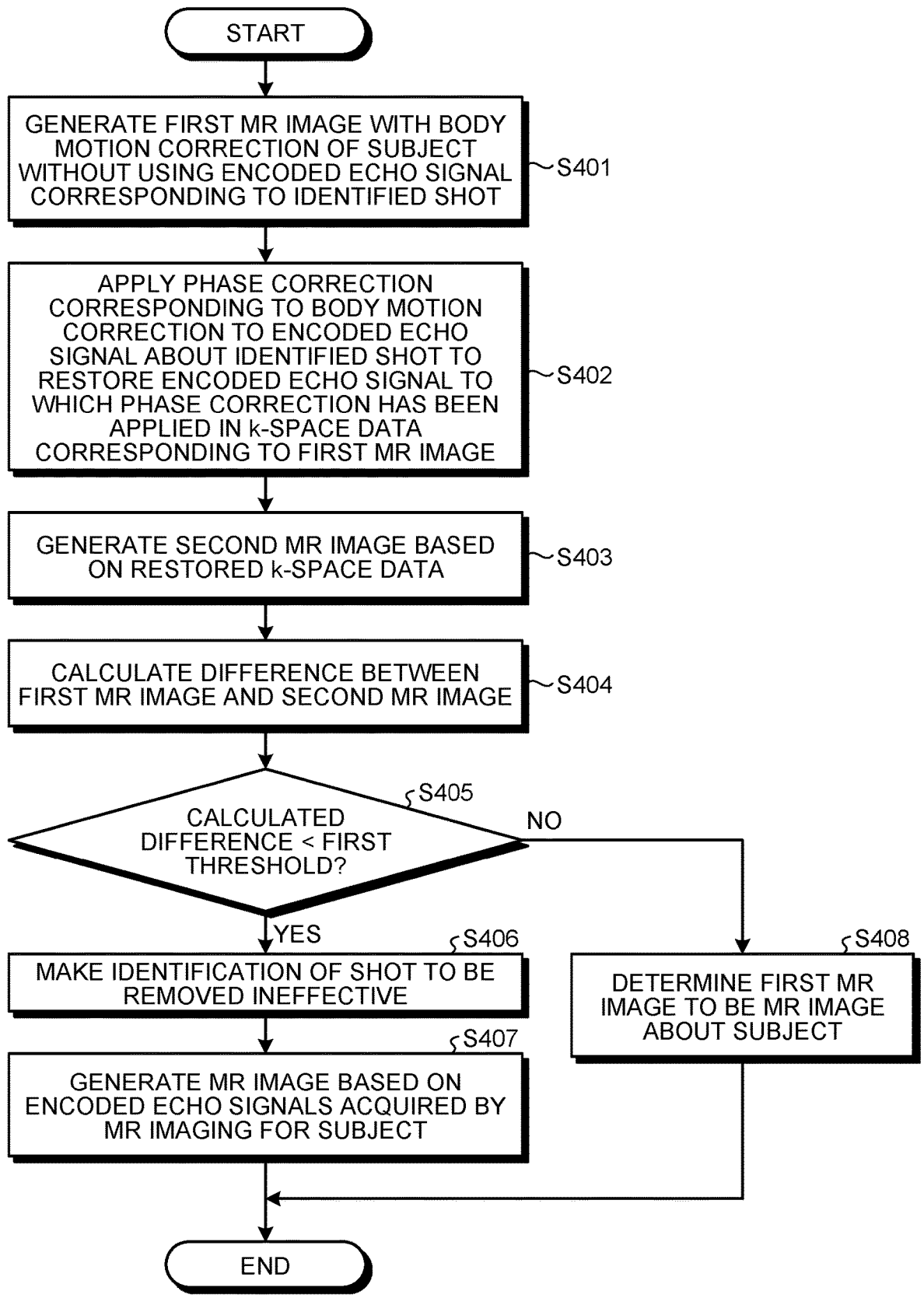
FIG. 4 is a flowchart of an example of a procedure of removal determination processing according to a first application example of the embodiment.

FIG. 4 is a flowchart of an example of a procedure of processing about removal determination (hereinafter, called removal determination processing). The processing at Step S401 illustrated in FIG. 4 is executed following Step S203 in FIG. 2.

Removal Determination Processing

Step S401

The processing circuit 131 generates a first MR image with the body motion correction of the subject without using the encoded echo signal corresponding to the identified shot by the generation function 39. The generation function 39 stores the first MR image in the memory 125. The method for generating the first MR image is similar to Step S204, and a description thereof is omitted.

Step S402

The processing circuit 131 applies phase correction corresponding to the body motion correction to the encoded echo signal about the identified shot by the generation function 39. Thus, the generation function 39 executes the phase correction corresponding to the body motion correction for the encoded echo signal about the identified shot. The generation function 39 executes Fourier transform for the first MR image to generate k-space data corresponding to the first MR image. The generation function 39 restores an encoded echo signal to which the phase correction has been applied in the k-space data. That is to say, the generation function 39 replaces the data of the phase encoding line about the identified shot with the encoded echo signal to which the phase correction has been applied in the k-space data. Thus, the generation function 39 generates restored k-space data, in which the encoded echo signal about the identified shot has been restored in the k-space data corresponding to the first MR image.

Step S403

The processing circuit 131 generates a second MR image based on the restored k-space data by the generation function 39. Specifically, the generation function 39 executes Fourier transform for the restored k-space data to generate the second MR image.

Step S404

The processing circuit 131 compares the first MR image and the second MR image with each other by the comparison function 35. Specifically, the comparison function 35 calculates a difference between the first MR image and the second MR image. The comparison function 35 calculates a value corresponding to the difference based on a differential between the first MR image and the second MR image, for example. Examples of the value corresponding to the difference include the sum of a plurality of pixel values in a differential image between the first MR image and the second MR image and an average of the pixel values. The comparison function 35 may calculate a statistical value indicating the correlation between the first MR image and the second MR image as the difference. Examples of the statistical value include a correlation value and a similarity degree.

Step S405

The processing circuit 131 compares the calculated difference and a certain threshold with each other by the comparison function 35. The certain threshold is a value determining the presence or absence of the difference between the first MR image and the second MR image and is set in advance and is stored in the memory 125. In the following, for the sake of the convenience of description, the certain threshold is called a first threshold. If the calculated difference is less than the first threshold (Yes at Step S405), the processing at Step S406 is executed. If the calculated difference is not less than the first threshold (No at Step S405), the processing at Step S408 is executed.

Step S406

The processing circuit 131 makes the identification of the shot to be removed ineffective by the identification function 37. As illustrated in FIG. 3, when the identified shot is the fourth shot, for example, the identification function 37 makes the identification for the fourth shot ineffective.

Step S407

The processing circuit 131 generates the MR image based on the encoded echo signals acquired by the MR imaging for the subject P by the generation function 39. Specifically, the generation function 39 performs body motion correction on the encoded echo signals to generate the MR image.

Step S408

The processing circuit 131 determines the first MR image as the MR image about the subject P by the identification function 37.

The MRI apparatus 100 according to the first application example of the embodiment described in the foregoing generates the first MR image with the body motion correction of the subject P without using the encoded echo signal corresponding to the identified shot, applies the phase correction corresponding to the body motion correction to the encoded echo signal about the identified shot to restore the echo signal to which the phase correction has been applied in the k-space data corresponding to the first MR image, generates the second MR image based on the restored k-space data, and, if the difference between the first MR image and the second MR image is smaller than the first threshold, makes the identification of the shot to be removed ineffective.

Thus, the MRI apparatus 100 according to the first application example can determine the presence or absence of the body motion of the subject P by the difference between the first MR image and the second MR image. The MRI apparatus 100 according to the first application example, when it is determined that the body motion of the subject P is absent in the determination (Yes at Step S405), can generate the MR image of the subject P based on the encoded echo signals (all the MR data) acquired by the MR imaging for the subject P. From these, the MRI apparatus 100 according to the first application example, when it is determined that the body motion of the subject P is absent (Yes at Step S405), can generate the MR image having a high SNR and can improve the throughput of image diagnosis about the subject P.

Second Application Example

Although the first application example describes performing the removal determination on an image basis, the present application example executes the removal determination in the k-space data. FIG. 5 is a flowchart of an example of a procedure of the removal determination processing of the present application example. The processing at Step S501 illustrated in FIG. 5 is executed following Step S203 in FIG. 2.

Removal Determination Processing

Step S501

The processing circuit 131 generates the k-space data with the body motion correction of the subject without using the encoded echo signal corresponding to the identified shot by the generation function 39. The generation function 39 stores the k-space data in the memory 125. The k-space data corresponds to Fourier transform of the first MR image. For the generation of the k-space data, a known method can be used as appropriate, and thus a description thereof is omitted.

Step S502

The processing circuit 131 compares an echo signal complemented about the identified shot in the k-space data (hereinafter, called a complemented echo signal) and the encoded echo signal corresponding to the identified shot (hereinafter, called an identified echo signal) with each other by the comparison function 35. Specifically, the comparison function 35 calculates a difference between the complemented echo signal and the identified echo signal. The comparison function 35 calculates a value corresponding to the difference based on a differential between the complemented echo signal and the identified echo signal, for example. Examples of the value corresponding to the difference include a differential value between the complemented echo signal and the identified echo signal. The comparison function 35 may calculate a statistical value indicating the correlation between the complemented echo signal and the identified echo signal as the difference. Examples of the statistical value include a correlation value and a similarity degree.

Step S503

The processing circuit 131 compares the calculated difference and a certain threshold with each other by the comparison function 35. The certain threshold is different from the first threshold and is thus called a second threshold for the sake of the convenience of description in the following. The second threshold is a value for determining the presence or absence of the difference between the complemented echo signal and the identified echo signal and is set in advance and is stored in the memory 125. If the calculated difference is less than the second threshold (Yes at Step S503), the processing at Step S504 is executed. If the calculated difference is not less than the second threshold (No at Step S503), the processing at Step S506 is executed.

Step S504

The processing circuit 131 makes the identification of the shot to be removed ineffective by the identification function 37. The processing at the present step is similar to that at Step S406 in FIG. 4, and thus a description thereof is omitted.

Step S505

The processing circuit 131 generates the MR image based on the encoded echo signals acquired by the MR imaging for the subject P by the generation function 39. The processing at the present step is similar to that at Step S407 in FIG. 4, and thus a description thereof is omitted.

Step S506

The processing circuit 131 generates the MR image about the subject P based on the k-space data generated at Step S501 by the generation function 39. Specifically, the generation function 39 executes Fourier transform on the k-space data to generates the MR image.

The MRI apparatus 100 according to the second application example of the embodiment described in the foregoing generates the k-space data with the body motion correction of the subject P without using the encoded echo signal corresponding to the identified shot and, if the difference between the complemented echo signal in the k-space data and the identified echo signal is smaller than the second threshold, makes the identification of the shot to be removed ineffective. The effects and the like of the present application example are similar to those of the first application example, and thus descriptions thereof are omitted.

Third Application Example

The present application example executes the image-based removal determination of the first application example and the removal determination on the k-space data of the second application example in a combined manner. The removal determination of the present application example conforms to that of the first application example and the second application example, and thus a description thereof is omitted. In the following, to simplify the description, the difference to be compared with the first threshold is called a first difference, whereas the difference to be compared with the second threshold is called a second difference. As described in the first application example and the second application example, the first difference and the second difference correspond to differentials. In the present application example, two criteria, or the first threshold and the second threshold, are used, and thus the following describes an example of a relation between these criteria and an image difference and a signal difference.

FIG. 6 is a diagram of an example about making the identification of the shot to be removed effective or ineffective by the first threshold and the second threshold in a first difference D1 and a second difference D2. A first upper limit value illustrated in FIG. 6 is a value larger than the first threshold and is set in advance. A second upper limit value illustrated in FIG. 6 is a value larger than the second threshold and is set in advance. The memory 125 stores therein the first upper limit value and the second upper limit value. When a correlation value or a similarity degree is used as the first difference D1 and the second difference D2, the direction of the signs of inequality illustrated in FIG. 6 is reversed, and the upper limit values correspond to lower limit values.

As illustrated in FIG. 6, when the first difference D1 is the first upper limit value or less and when the second difference D2 is the second upper limit value or less, the identification of the shot to be removed is made ineffective. When the first difference D1 is greater than the first upper limit value and/or when the second difference D2 is greater than the second upper limit value, the identification of the shot to be removed is made effective. The table illustrated in FIG. 6 is an example and is not limiting. Making the identification of the shot to be removed effective or ineffective in the table illustrated in FIG. 6 may be set as appropriate in accordance with the SNR permitted by the image type of the MR image or be changed as appropriate through an instruction by a user via the input interface 127, for example.

The MRI apparatus 100 according to the third application example of the embodiment described in the foregoing generates the first MR image with the body motion correction of the subject P without using the encoded echo signal corresponding to the identified shot, applies the phase correction corresponding to the body motion correction to the encoded echo signal corresponding to the identified shot to restore the echo signal to which the phase correction has been applied in the k-space data corresponding to the first MR image, generates the second MR image based on the restored k-space data, calculates the first difference D1 between the first MR image and the second MR image and the second difference D2 between the complemented echo signal complemented about the identified shot in the k-space data about the first MR image and the encoded echo signal corresponding to the identified shot, and makes the identification of the shot to be removed ineffective based on a first comparison result by a comparison between the first difference D1 and the first threshold and a second comparison result by a comparison between the second difference D2 and the second threshold. The removal determination, the effects, and the like of the present application example are similar to those of the first application example and the second application example, and thus descriptions thereof are omitted.

Fourth Application Example

The present application example executes the processing at Step S201 to Step S203 of the body motion correction processing illustrated in FIG. 2 in real time during the execution of the MR imaging for the subject P to again execute the MR imaging about the shot to be removed and to acquire the encoded echo signal about the identified shot.

The processing circuit 131 acquires each of the dummy echo signals in accordance with execution of each of the shots during the execution of the MR imaging for the subject P by the acquisition function 33, for example. The processing circuit 131 compares the dummy echo signals with each other about the shots in accordance with the acquisition of the dummy echo signals during the execution of the MR imaging by the comparison function 35. The processing circuit 131 identifies the shot to be removed based on the comparison result during the execution of the MR imaging by the identification function 37. The processing circuit 131 again acquires the encoded echo signal about the identified shot by additional MR imaging about the identified shot following the MR imaging by the acquisition function 33. The processing circuit 131 generates the MR image of the subject P based on the encoded echo signals corresponding to the shots except the identified shot and the encoded echo signal having again been acquired by the generation function 39.

The processing circuit 131, if the correlation between the dummy echo signal about the second shot and the reference echo signal is a certain value or less, may identify the first shot and the second shot as the shot to be removed by the identification function 37. In this process, the imaging control circuit 121 again executes the MR imaging about the first shot and the second shot following the end of the MR imaging being executed.

The identification of the shot to be removed by the identification function 37 is not limited to the successive execution in accordance with the acquisition of the dummy echo signal. The processing circuit 131 may execute the identification of the shot to be removed by the identification function 37 in accordance with the acquisition of the dummy echo signal of the third shot, the fourth shot, or later one, for example. The identification function 37 may execute the identification of the shot to be removed with the total number of the dummy echo signals reaching a preset number as a trigger.

The MRI apparatus 100 according to the fourth application example of the embodiment described in the foregoing acquires each of the dummy echo signals in accordance with the execution of each of the shots during the execution of the MR imaging, compares the dummy echo signals with each other about the shots in accordance with the acquisition of the dummy echo signals during the execution of the MR imaging, identifies the shot to be removed based on the comparison result among the dummy echo signals during the execution of the MR imaging, and again acquires the encoded echo signal about the identified shot by the MR imaging about the identified shot following the MR imaging.

From these, the MRI apparatus 100 according to the fourth application example evaluates the dummy echo signals acquired at the same time as the collection of the encoded echo signals and can thereby detect the body motion of the subject P in real time. Thus, the MRI apparatus 100 according to the fourth application example can perform removal of the encoded echo signal (the MR data) and reimaging when the subject P moves during the collection of the encoded echo signals. That is to say, the MRI apparatus 100 according to the fourth application example can collect the encoded echo signals with less body motion of the subject P.

From these, the MRI apparatus 100 according to the fourth application example effectively reduces the motion artifact without reducing the SNR and can thus generate the MR image with improved image quality at low calculation costs. From the foregoing, the MRI apparatus 100 according to the present application example does not reduce the throughput of the MR imaging for the subject P and can at the same time improve the throughput of image diagnosis about the subject P.

When the technical thought of the present invention is implemented by the method for identifying a body motion-related shot, the method for identifying a body motion-related shot acquires a plurality of echo signals not to be encoded corresponding to a plurality of respective shots about acquisition of a plurality of echo signals having been encoded by MR imaging for the subject P, compares the echo signals not to be encoded with each other about the shots, and identifies a shot to be removed about generation of an MR image for the subject P out of the shots based on a comparison result of the echo signals not to be encoded. The procedure and the effects of body motion correction processing executed by the method for identifying a body motion-related shot are similar to those of the embodiment, and thus descriptions thereof are omitted.

When the technical thought of the present invention is implemented by the body motion-related shot identification program, the body motion-related shot identification program causes a computer to implement acquiring a plurality of echo signals not to be encoded corresponding to a plurality of respective shots about acquisition of a plurality of echo signals having been encoded by MR imaging for the subject P, comparing the echo signals not to be encoded with each other about the shots, and identifying a shot to be removed about generation of an MR image for the subject P out of the shots based on a comparison result of the echo signals not to be encoded. The body motion-related shot identification program is stored in a computer-readable non-volatile storage medium, for example.

The body motion correction processing can also be implemented by installing the body motion-related shot identification program from the non-volatile storage medium to various kinds of server apparatuses (processing apparatuses) about medical data processing and developing it onto a memory, for example. In this process, the computer program enabling a computer to execute the method can also be stored in a storage medium such as a magnetic disk (a hard disk or the like), an optical disc (compact disc read only memory (CD-ROM), a digital versatile disc (DVD), or the like), or a semiconductor memory and be distributed. The processing procedure and the effects of the body motion-related shot identification program are similar to those of the embodiment, and thus descriptions thereof are omitted.

At least one embodiment or the like described in the foregoing can detect the body motion of a subject about body motion correction without performing any complicated calculations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising a processing circuit configured to
    acquire a plurality of echo signals not to be encoded corresponding to a plurality of respective shots about acquisition of a plurality of echo signals having been encoded by magnetic resonance imaging for a subject,
    compare the echo signals not to be encoded with each other about the shots, and
    identify a shot to be removed about generation of a magnetic resonance image about the subject out of the shots based on a comparison result of the echo signals not to be encoded.

2. The magnetic resonance imaging apparatus according to claim 1, wherein the processing circuit, with an echo signal not to be encoded about a shot as a reference among the shots in the echo signals not to be encoded as a reference echo signal, calculates correlation values between the reference echo signal and the echo signals not to be encoded as the comparison result.

3. The magnetic resonance imaging apparatus according to claim 2, wherein the processing circuit identifies a shot about an echo signal not to be encoded having smallest correlation with the reference echo signal out of the echo signals not to be encoded as the shot to be removed.

4. The magnetic resonance imaging apparatus according to claim 2, wherein the shot as a reference is a shot executed first among the shots.

5. The magnetic resonance imaging apparatus according to claim 2, wherein, when the correlation values are comparable to each other about the shots, the processing circuit identifies the shot as a reference as the shot to be removed.

6. The magnetic resonance imaging apparatus according to claim 1, wherein the processing circuit generates the magnetic resonance image without using an echo signal having been encoded corresponding to the shot having been identified.

7. The magnetic resonance imaging apparatus according to claim 1, wherein the processing circuit
    generates a first magnetic resonance image with body motion correction of the subject without using an echo signal having been encoded corresponding to the shot having been identified,
    applies phase correction corresponding to the body motion correction to the echo signal having been encoded about the shot having been identified to restore an echo signal to which the phase correction has been applied in k-space data corresponding to the first magnetic resonance image,
    generates a second magnetic resonance image based on the restored k-space data, and
    makes the identification of the shot to be removed ineffective when a difference between the first magnetic resonance image and the second magnetic resonance image is smaller than a certain threshold.

8. The magnetic resonance imaging apparatus according to claim 1, wherein the processing circuit
    generates k-space data with body motion correction of the subject without using an echo signal having been encoded corresponding to the shot having been identified, and
    makes the identification of the shot to be removed ineffective when a difference between an echo signal complemented about the shot having been identified in the k-space data and the echo signal having been encoded corresponding to the shot having been identified is smaller than a certain threshold.

9. The magnetic resonance imaging apparatus according to claim 1, wherein the processing circuit
    generates a first magnetic resonance image with body motion correction of the subject without using an echo signal having been encoded corresponding to the shot having been identified,
    applies phase correction corresponding to the body motion correction to the echo signal having been encoded corresponding to the shot having been identified to restore an echo signal to which the phase correction has been applied in k-space data corresponding to the first magnetic resonance image,
    generates a second magnetic resonance image based on the restored k-space data,
    calculates a first difference between the first magnetic resonance image and the second magnetic resonance image and a second difference between an echo signal complemented about the shot having been identified in k-space data about the first magnetic resonance image and the echo signal having been encoded corresponding to the shot having been identified, and
    makes the identification of the shot to be removed ineffective based on a first comparison result by a comparison between the first difference and a first threshold and a second comparison result by a comparison between the second difference and a second threshold.

10. The magnetic resonance imaging apparatus according to claim 1, wherein the processing circuit
    acquires each of the echo signals not to be encoded in accordance with execution of each of the shots during execution of the magnetic resonance imaging,
    compares the echo signals not to be encoded with each other about the shots in accordance with the acquisition of the echo signals not to be encoded during the execution of the magnetic resonance imaging,
    identifies the shot to be removed based on the comparison result during the execution of the magnetic resonance imaging, and
    again acquires an echo signal having been encoded about the shot having been identified by magnetic resonance imaging about the shot having been identified following the magnetic resonance imaging.

11. The magnetic resonance imaging apparatus according to claim 1, wherein the processing circuit generates the magnetic resonance image with body motion correction for the subject without using an echo signal having been encoded corresponding to the shot having been identified.

12. A method for identifying a body motion-related shot, the method comprising:
  acquiring a plurality of echo signals not to be encoded corresponding to a plurality of respective shots about acquisition of a plurality of echo signals having been encoded by magnetic resonance imaging for a subject;
  comparing the echo signals not to be encoded with each other about the shots; and
  identifying a shot to be removed about generation of a magnetic resonance image about the subject out of the shots based on a comparison result of the echo signals not to be encoded.

13. A computer-readable non-volatile storage medium storing therein a body motion-related shot identification program causing a computer to implement:
  acquiring a plurality of echo signals not to be encoded corresponding to a plurality of respective shots about acquisition of a plurality of echo signals having been encoded by magnetic resonance imaging for a subject;
  comparing the echo signals not to be encoded with each other about the shots; and
  identifying a shot to be removed about generation of a magnetic resonance image about the subject out of the shots based on a comparison result of the echo signals not to be encoded.

* * * * *